United States Patent
Schiepp et al.

(10) Patent No.: US 9,450,170 B2
(45) Date of Patent: Sep. 20, 2016

(54) ACTUATOR USING MAGNETIC SHAPE MEMORY MATERIAL, COILS AND PERMANENT MAGNETS

(75) Inventors: Thomas Schiepp, Seitingen-Oberflacht (DE); Markus Laufenberg, Stockach (DE)

(73) Assignee: ETO Magnetic GmbH, Stockach (DE)

( * ) Notice: Subject to any disclaimer, the term of this patent is extended or adjusted under 35 U.S.C. 154(b) by 144 days.

(21) Appl. No.: 14/005,365

(22) PCT Filed: Mar. 15, 2012

(86) PCT No.: PCT/EP2012/054542
§ 371 (c)(1),
(2), (4) Date: Sep. 16, 2013

(87) PCT Pub. No.: WO2012/123535
PCT Pub. Date: Sep. 20, 2012

(65) Prior Publication Data
US 2014/0091646 A1    Apr. 3, 2014

(30) Foreign Application Priority Data

Mar. 16, 2011  (DE) .................... 10 2011 014 193

(51) Int. Cl.
  *H01L 41/12*    (2006.01)
  *H01L 41/20*    (2006.01)
  *H02N 2/00*    (2006.01)

(52) U.S. Cl.
  CPC ............... *H01L 41/12* (2013.01); *H01L 41/20* (2013.01); *H02N 2/00* (2013.01); *H02N 2/005* (2013.01)

(58) Field of Classification Search
  CPC ....... H01L 41/20; H01L 41/12; H01L 41/26; H02N 2/00; H02N 2/005; H02K 5/10; H02K 5/16

USPC ................. 310/26, 89–91, 52, 402, 156.01; 335/220–232; 333/148, 201; 336/20; 367/156, 168; 361/206; 318/118
See application file for complete search history.

(56) References Cited

U.S. PATENT DOCUMENTS

| 6,157,101 | A  |     | 12/2000 | Ullakko |           |
|-----------|----|-----|---------|---------|-----------|
| 6,515,382 | B1 | *   | 2/2003  | Ullakko | F16D 65/14 310/26 |
| 7,246,489 | B2 | *   | 7/2007  | Du Plessis | F16K 31/0613 251/129.06 |
| 2005/0001367 | A1 | * | 1/2005 | Taya | H02N 2/10 267/166 |
| 2009/0115284 | A1 | * | 5/2009 | Liang | H01L 41/12 310/300 |

FOREIGN PATENT DOCUMENTS

| DE | EP 2339595 A1 * | 6/2011 | ............. C22C 19/03 |
| EP | 0997953 A1 | 5/2000 |
| EP | 2339595 A1 | 6/2011 |
| WO | 9945631 A2 | 9/1999 |

OTHER PUBLICATIONS

Laufenberg Markus; Pagounis Emmanouel, Magnetic Shape Memory Alloy Material, Jun. 29, 2012, EP 2339595.*
Rolfs, K; Wimpory; R C, Petry; W, Schneider, R, Effect of Alloying Ni—Mn—Ga with Cobalt on Thermal and Structural Properties, 2010 Journal of Physics Conference Series 251 012046, pp. 1-4.

* cited by examiner

*Primary Examiner* — Terrance Kenerly
*Assistant Examiner* — Alexander Singh
(74) *Attorney, Agent, or Firm* — Bachman & LaPointe, PC

(57) ABSTRACT

An actuator having a drive element made of a magnetic shape memory material is driven responsive to electrical control of a plurality of coil apparatuses and carries out an expansion movement in response to the control. The coil apparatuses are magnetically connected to the drive element via flux-concentrating apparatus having a flux-concentrating section associated with the coil apparatuses for interaction with the drive element. Each flux-concentrating apparatus has a core section and connecting section, which conducts a magnetic flux to the drive element, such that a magnetic flux-concentrating circuit for each of the coil apparatuses is formed by the common drive element. The flux-concentrating circuits are magnetically connected in parallel with one another, based on the common drive element, and/or a magnetic flux direction of a magnetic flux in the particular flux-concentrating circuit in the drive element has the same orientation.

17 Claims, 4 Drawing Sheets

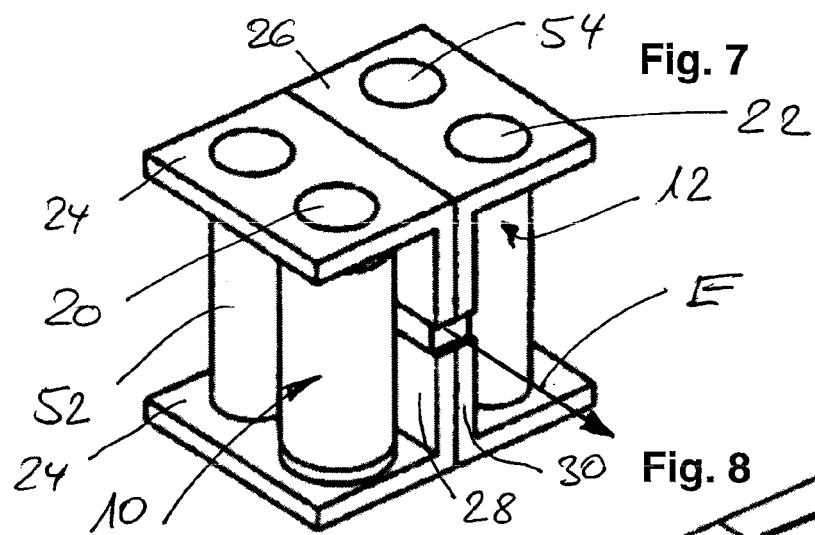
Fig. 7
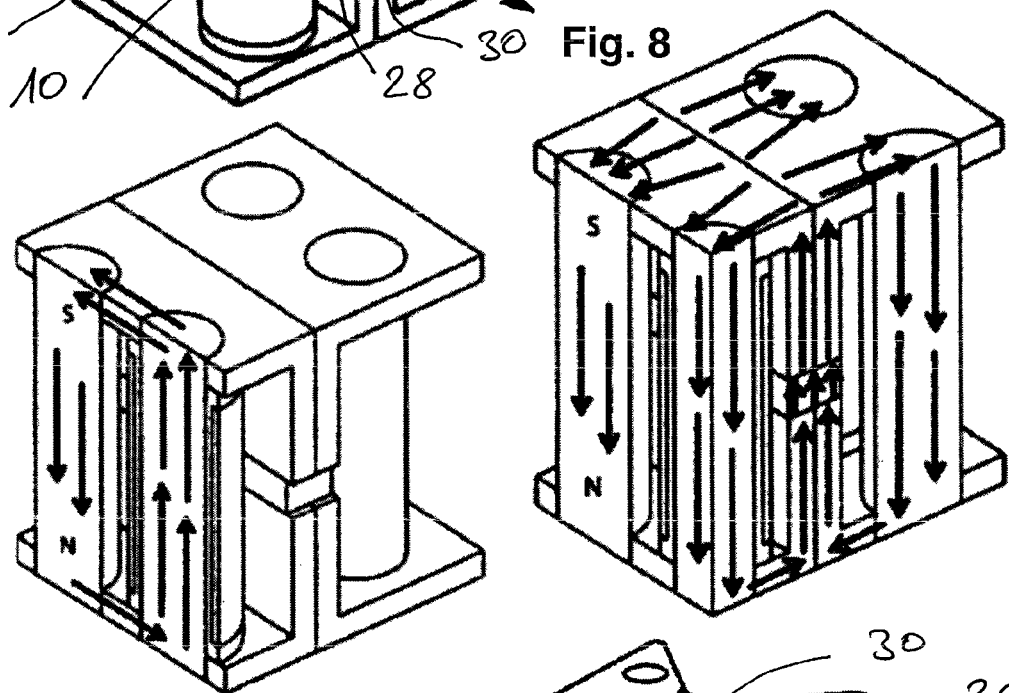
Fig. 8
Fig. 9
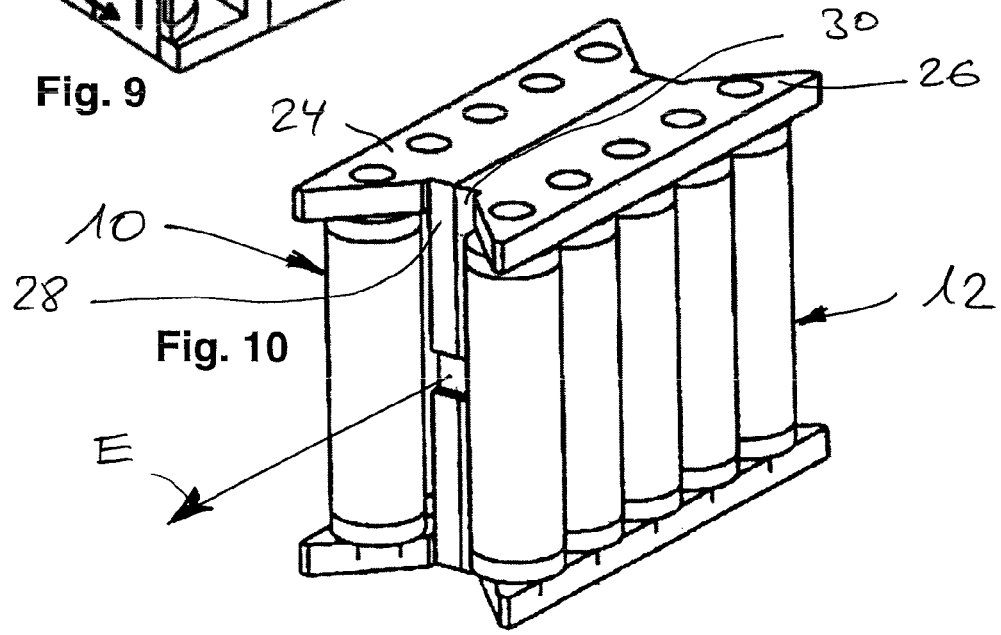
Fig. 10

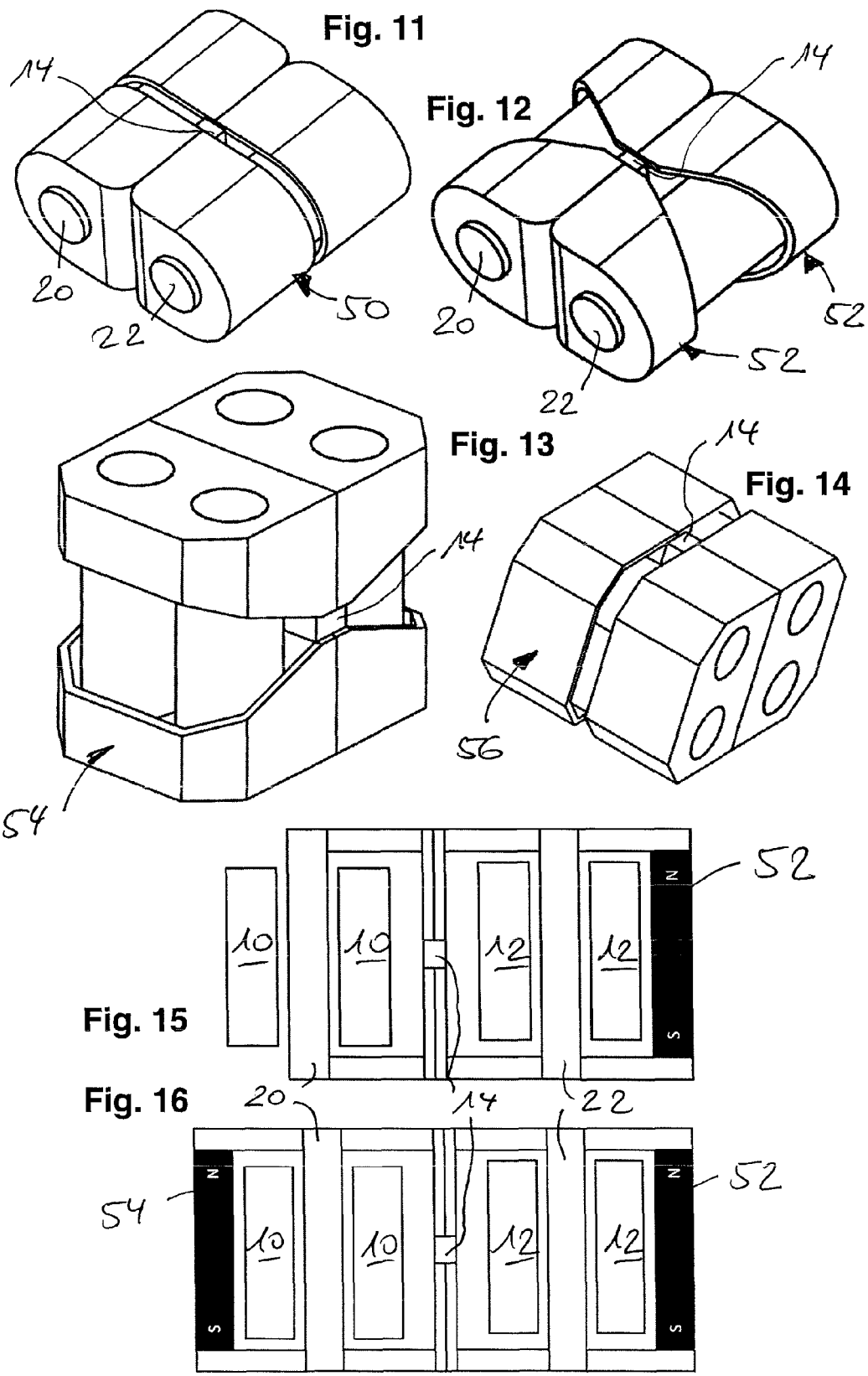

ACTUATOR USING MAGNETIC SHAPE MEMORY MATERIAL, COILS AND PERMANENT MAGNETS

BACKGROUND OF THE INVENTION

The present invention concerns an actuator as it is disclosed in WO 99/45631.

Electromagnetic actuation devices, in which a shape memory material (shape memory alloy material) experiences an expansion as a reaction to an applied magnetic field and as a result can then interact with an actuation partner to execute an actuation reaction, are of known prior art. Typically a coil device is thereby assigned to the magnetic shape memory material (MSM="Magnetic Shape Memory"), which as a reaction to an energisation generates the magnetic field required for the expansion of the shape memory drive element. Since in typical drive element configurations, for example, along a designated axis of expansion of extended bodies, for purposes of triggering the expansion movement a magnetic field input must occur in the body orthogonal to the direction of expansion, a compact build shape can be achieved only with difficulty when implementing suitable modular arrangements or modules, for instance as replacements for common electromagnetic actuators.

While, for instance, the applicant's unpublished German property right application DE 102010 010801 with the deployment of suitable flux-conducting elements for a coil magnetic flux envisages an option in which, in an analogous manner to a conventional cylindrical electromagnetic actuation device, the magnetic coil surrounds the extended drive element coaxially, at least two coil devices are usually deployed for purposes of enabling a magnetic flux input into the drive element; these are typically provided on both sides adjacent to the MSM drive element body.

Such a configuration, presumed to be of known art, then enables, even when deploying standardised flux-conducting modules for the implementation of a magnetic flux circuit, simple and reproducible manufacturing properties for the drive element, although at the same time energetic and volumetric disadvantages arise.

Thus, for instance with the energisation of a first coil device (of a pair of coil devices provided located opposite each other with respect to a central drive element and magnetically connected in series to each other and also to the MSM drive element) sitting on a related core section of a flux-conducting structure, a magnetic flux thereby generated is displaced into an opposing arm and there into the core region of the coil device there provided. The same applies, in the event of the activation of the opposing coil device, for the core region of the first coil device. The end result is that in the case of two activated coil devices a respective effective cross-section of the core region must be dimensioned sufficiently large such that the mutually overlapping fluxes of the two coil devices can be controlled. The disadvantageous consequence of these influences is that the modules of the magnetic circuit must be dimensioned (unnecessarily) large, with resulting disadvantages in dimensions, weights, and costs. In contrast, actuators of small dimensions would definitely bring with them performance disadvantages under these conditions, particularly in terms of undesirable heating and/or prolonged movement and switching times.

With regard to the further prior art reference is made to the article by Rolfs K et al: "Effect of alloying Ni—Mn—Ga with cobalt on thermal and structural properties", Journal of Physics: Conference Series, Vol. 251, 2010, Pages 012046/1-4 (XP55029781).

SUMMARY OF THE INVENTION

The object of the present invention is therefore to improve a generic actuator, in which a plurality (i.e. at least two) of coil devices act in a flux-generating manner on a (common) drive element of a magnetic shape memory material, such that the effective magnetic flux input into the drive element is improved, in particular any disadvantageous magnetic flux through core regions of other coil devices is diminished or reduced, and correspondingly the compactness of a generic device can be improved by the reduction of module dimensions, in particular cross-sectional dimensions, with comparable magnetic properties, and movement times and switching times can be increased with reduced heat generation.

The object is achieved by the actuator disclosed herein; advantageous further developments of the invention are also described.

In an inventively advantageous manner for each of the coil devices (interacting with the common drive element) a particular flux-conducting circuit is formed such that in an activated or operating state, i.e. in which each of the coil devices is energised, a magnetic flux of the coil device in question is managed in the assigned flux-conducting circuit and through the common drive element implemented in the magnetic shape memory material; at the same time, however, the magnetic flux of a first flux-conducting circuit is prevented from entering into the flux-conducting circuit of a second coil device. In this respect an effective separation of the respective flux-conducting circuits from one another occurs in the form of a parallel magnetic circuit based on the (common) drive element, with the advantageous effect that the respective magnetic flux-conducting components so of these flux-conducting circuits, namely the inventive core and connecting sections, must simply be designed and dimensioned such that these are matched to the magnetic flux of the related coil device, but must not control any additional flux components of other flux-conducting circuits (i.e. of related coil devices). In magnetic design terms this is advantageously achieved in that in the operating state the flux directions of the magnetic flux from the respective flux-conducting circuits are directed on top of each other into the (one-piece or multi-piece) flux conducting section for the common drive element, and then in the flux-conducting section, i.e. through the drive element in the inventive manner are rectified, i.e. aligned in the same direction; thus this configuration effectively prevents, against the magnetic flux direction of another flux-conducting circuit, a certain coil magnetic flux of a first coil device from being able to flow through a connecting section and a core section into another flux-conducting circuit (outside of the parallel connected, i.e. managed aligned in the common/same direction, flux-conducting section).

The advantageous consequence is that the cross-sections required for the magnetic flux circuits, in particular in the respective core regions of the coil devices, i.e. in the connecting sections, can be significantly reduced. From this there follows on the one hand the advantageous option of implementing lighter and more compact actuator devices; on the other hand a significantly lower rise in temperature ensues, which in turn is beneficial for the functional capability of the MSM shape memory material (for its functional capability it must typically be ensured that operating temperatures remain below the phase transition temperature and Curie temperature for the respective alloy material) and movement times and switching times are reduced.

Here, in the context of preferred further developments of the invention, it is sensible and preferable to provide two (or more) of the coil devices by an appropriate configuration of the related magnetic flux-conducting circuits relative to the drive element such that the coil devices are arranged spaced apart, in particular are located opposite one another. In this manner it is then possible to implement a particularly compact device, which in particular takes up the modular concepts described in the introduction and thus makes the inventive actuator device accessible to various adjustable inserts.

It is particularly preferable in this connection, for instance, to configure the flux section and a connecting section (typically engaging on both sides of a coil) in the form of a frame, further preferably in one piece, wherein such magnetic flux-conducting bodies can then be particularly preferably assembled as identically produced modules to form actuators of the present invention. In this form of implementation the drive element would then be arranged in a transition region of two (preferably planar) flux-conducting sections, located on top of each other and in accordance with further developments, produced for instance from a magnetically conducting sheet material, and would thus contribute to a compact overall arrangement.

As an additional possible further development, to each of the coil devices interacting with the (common) drive element is assigned a particular flux-conducting section in the form of the first or further (e.g. second) flux conducting section, wherein, in the case of more than two coil devices, also the first or second flux-conducting section can be subjected to magnetic flux from more than one coil device. By this means the presumption is advantageously created that while the first and second flux-conducting section in each case introduces the magnetic flux of the assigned coil device into the (commonly) assigned drive element, the respective magnetic flux circuits can, however, be separated from one another, or suitably decoupled from one another.

In the context of preferred forms of embodiment of the invention it is constructively beneficial to design a one-piece flux-conducting section used in common by the plurality of flux-conducting circuits, alternatively a first and also a further flux-conducting section as second separated and/or decoupled flux conducting sections of the respective flux-conducting circuits, for instance running along a direction of extent of the coil devices in an extended manner, and to direct them parallel to one another such that in the above described manner a compact, modular build form arises from the synergy, at the same time, by means of, for instance, the sheet metal technology, in other respects of known art, a sufficient separation or decoupling in magnetic flux terms between the respective circuits is ensured. The alternative form of realisation of a one-piece and/or common flux-conducting section for the drive element can similarly be implemented in a modular mechanical design by means of suitable sheet metal elements or similar modules. In the context of these preferred forms of embodiment, but also independently of the latter, it is preferable in accordance with further developments to configure the drive element of the magnetic shape memory material in terms of a rectangular and/or a polygonal cross-section, that is to say non-cylindrically and preferably with plane outer surfaces in such a manner that in the interaction with the connecting section (which in turn preferably has corresponding plane surfaces of engagement) an optimum introduction of magnetic flux into the drive element can take place. Here once again in accordance with further developments and/or independently of this approach it is preferable to configure the drive element such that the introduction of the magnetic flux does not take place along the longest axis or dimension of extent of the drive element, but rather preferably along, or in, a short axis in accordance with further developments, for instance the shortest axis.

It is particularly preferable and in accordance with further developments for provision to be made to supplement the inventive actuator with permanent magnetic means. These permit an optimisation of the device in several regards, thus it is on the one hand possible by means of appropriate integration of a permanent magnet body (or a section of a permanent magnet material) to ensure in at least one of the magnetic flux circuits for a (permanent) magnetic preloading of the MSM drive element, so that then, for instance, a smaller (superposed) coil magnetic flux is required in order to trigger the desired expansion reaction. Also it is possible with the aid of a permanent magnetic element, for instance in additional interaction with a compression spring acting in an opposing manner, to implement a bi-stable switching behaviour of the drive element.

Additionally or alternatively provision is made in the context of preferred further developments of the invention to arrange the permanent magnetic means and to make possible an interaction with the magnetic flux-conducting circuit such that the permanent magnetic flux is influenced, i.e. switched in a purposeful manner by the energisation state of a related coil device: thus it is, for example, envisaged and beneficial to couple the permanent magnetic means into the magnetic flux-conducting circuit such that as a reaction to the electrical activation of the coil device the permanent magnetic flux is displaced (from a flow through the core region of the coil device in the de-energised state). In this respect the invention enables a purposeful influencing of the magnetic flux behaviour in the actuator in a particularly simple and elegant manner, once again with positive outcomes in terms of build size, heat generation and switching behaviour.

This aspect of the invention acquires a particular significance if in a purposeful manner and by the use of such permanent magnetic means (parallel-permanent magnetic means) connected magnetically in parallel to at least one of the coil devices a purposeful increase in magnetic flux in the drive element is executed, namely in that as a reaction to an activation (energisation) of a coil device the permanent magnetic field is displaced into the drive element; at the same time in the form of an outwardly mounted parallel permanent magnetic arm, such parallel-permanent magnetic means can constructively be advantageously and simply introduced into a suitable flux-bearing housing of the actuator.

In mechanical terms, and with the intent of designing the inventive actuator as a modular module, it is particularly preferable to provide the latter in a housing or a comparable encapsulated structure, here it is both possible and comprised by the invention in accordance with further developments to assign a shell to the inventive arrangement in a manner in other respects of known art, wherein this shell in the above described sense can either be completely or partially designed to be magnetically flux-conducting, and thus can be part, for instance, of a short-circuit arm for the (parallel-) permanent magnetic means provided in accordance with further developments, in addition it advantageously acts so as to reduce stray fluxes, also (additionally or alternatively) the modules can be insert moulded with a magnetically non-conducting material, preferably a plastic, such that just an access to the movable drive element remains.

The end result is that in a simple and elegant manner the present invention permits the magnetic field advantages of a plurality of coil devices (compared with an individual coil, for instance) in terms of the MSM drive element to be combined with an optimised flux-conducting structure, with reduced ohmic losses and heat generation, which in addition to design simplicity, enables short switching and movement times.

BRIEF DESCRIPTION OF THE DRAWINGS

Further advantages, features, and details of the invention ensue from the following description of preferred examples of embodiment and also with the aid of the figures; in the latter:

FIGS. 7 to 9 show a further form of embodiment of the invention with additionally provided permanent magnetic means for the further development of the implementation principle of FIG. 2, wherein FIG. 8 shows the energised state of the coil devices and FIG. 9 shows their de-energised state, FIG. 10 shows a further example of embodiment of the actuator, wherein a plurality of coil devices are in each case assigned to both the first flux-conducting section, and also the second flux-conducting section;

FIGS. 11 and 12 show variants of the example of embodiment of FIG. 2 with an almost completely closed (FIG. 11) or partially closed (FIG. 12) housing casing for purposes of the reduction of magnetic stray fields;

FIGS. 13 and 14 show variants of the examples of embodiment of FIGS. 11, 12 for an arrangement with four coils in each case;

FIGS. 15 and 16 show a schematic representation analogous to FIG. 1, however for purposes of clarification with (parallel-) permanent magnets located outwardly mounted for purposes of controlled superposition or displacement of a permanent magnetic flux.

DETAILED DESCRIPTION

Figure 1:
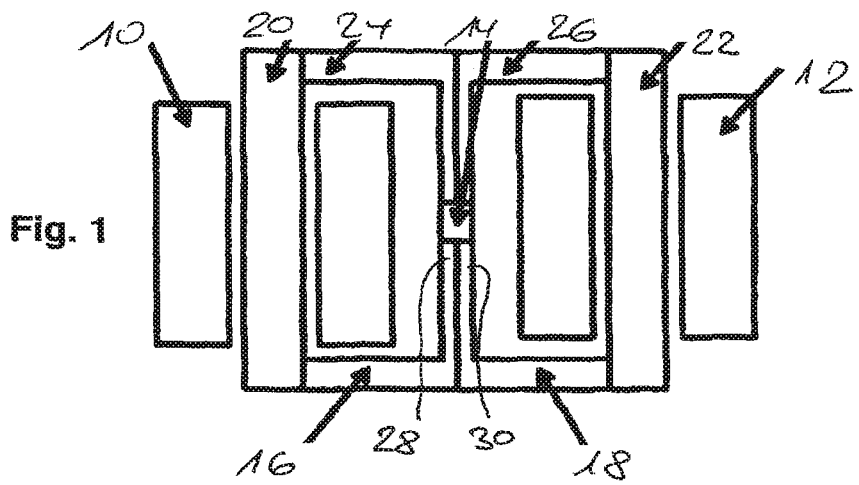
FIG. 1 shows a schematic sectional view of a first form of embodiment of the inventive actuator as an arrangement with two coil devices.
Figure 2:
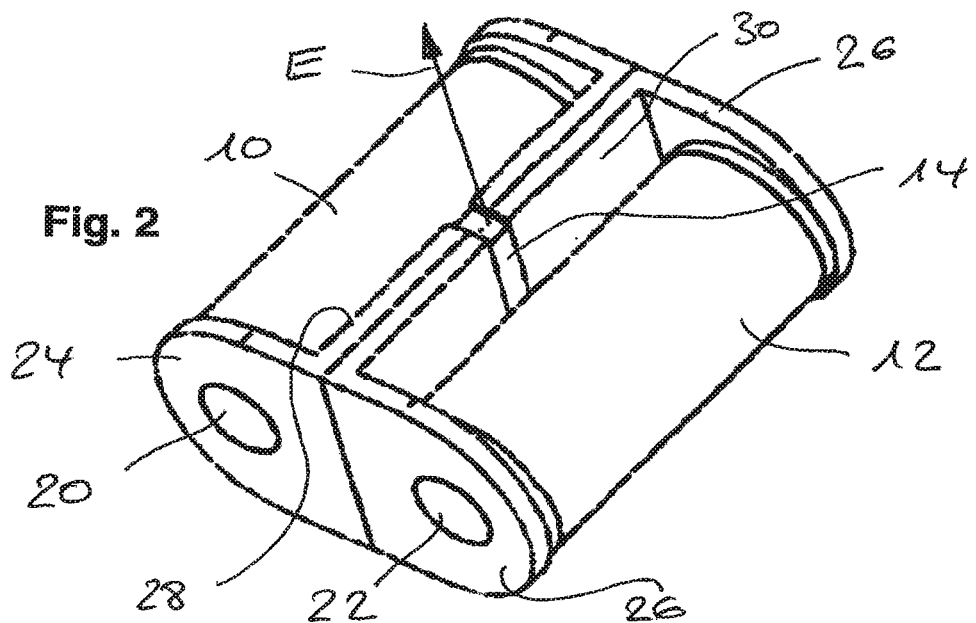
FIG. 2 shows a perspective view of a practical implementation of the conceptual example of embodiment shown in FIG. 1.
Figure 3:
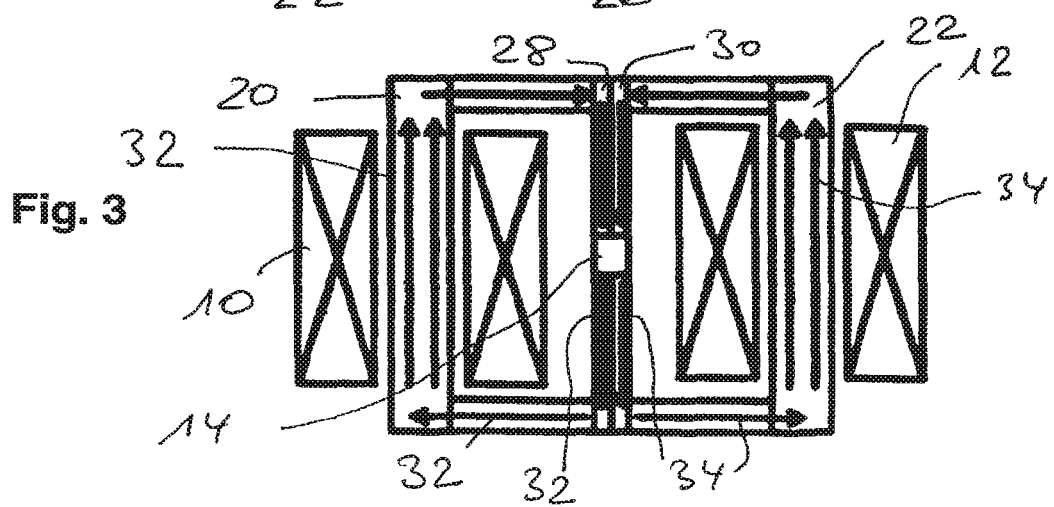
FIG. 3 shows a view analogous to FIG. 1 with schematically represented magnetic flux paths in the respective (separated) flux-conducting circuits.

A first form of embodiment of the invention, represented in FIGS. 1 to 3, has an actuator with two coil devices 10, 12, which are located opposite to each other, with respect to an extended MSM drive element 14 (direction of expansion at right-angles out of the plane of FIG. 1). The magnetic flux-conducting circuits 16, 18 respectively are assigned to the coil devices 10, 12 respectively; the circuits consist of core regions 20, 22 respectively, surrounded by the coils 10, 12, adjacently connecting sections 24, 26 respectively and in each case flux-conducting sections 28, 30 respectively introducing a magnetic flux of the energised coils 10, 12 into the drive element 14.

In the practical implementation, cf. the perspective view of a possible build in FIG. 2, the flux-conducting sections 28, 30 respectively are designed as flat central sections (more precisely: the respective central core sections of the latter) of a frame arrangement encompassing a coil 10, 12 respectively at either end; the frame is preferably produced from a (transformer) sheet metal material or a similar magnetically-conducting flat material, and in the manner shown in FIG. 2 in the central region is in each case interrupted so as to receive the drive element 14. Its direction of expansion is illustrated by the arrow E in FIG. 2. Further developments of this variant are shown in the first instance in FIGS. 11, 12, with housing surfaces 50, 52 of a magnetically-conducting material, which extend laterally so as to form a stray field screen. In turn this form of embodiment is varied by means of an arrangement of four coil units, which are designed with appropriately partially closed or completely closed housing casing sections 54, 56.

FIG. 3 shows how in the case of energisation of the coils 10, 12 of the example of embodiment an additive magnetic flux path composed of individual fluxes 32, 34 respectively from the respective magnetic flux-conducting circuits is managed through the flux drive element commonly subjected to the fluxes; at the same time the path of the arrows illustrates that (represented idealistically) no magnetic coupling occurs between the respective individual circuits; on the contrary, any path, for instance, of components of the flux 32 is prevented from reaching the core region 22, and vice versa no component of the flux 34 reaches the core region 20. Thus this representation illustrates how, in accordance with the present invention, the flux components 32, 34 respectively run aligned in the same directional sense relative to one another (rectified) through the flux sections 28, 30 respectively (wherein the latter can alternatively also be equipped as a one-piece/or common flux section), such that in the representation in FIG. 3 the respective flux-conducting circuits, with respect to the drive element 14, experience a parallel arrangement of the respective magnetic fluxes of the individual circuits (of the coil devices 10, 12 respectively). As moreover the two paths of the respective flux-conducting circuits in FIG. 3 illustrate, by means of this inventive procedure a magnetic flux from a first core region (e.g. 20 via the related connecting section 24) is sensibly prevented from entering into a connecting section 26 of the second core region 22; on the contrary there takes place through the opposingly directed flux direction into the adjacent connecting sections 24 and 26 a respective deflection of the flux components (32, 34) into the flux-conducting sections 28, 30, so as to bring about the inventive parallel circuit, i.e. a rectified magnetic flux management.

In this manner the cores can advantageously be of small dimensions without the risk of magnetic saturation, with the corresponding advantages of coils of small dimensions and a compact overall arrangement. As required and in a manner in other respects of known art a restoring device can be assigned to the drive element (since usually, in the case of the example of embodiment shown, the latter after it has been subjected to a magnetic field remains in its expanded position and must be restored by mechanical intervention, for instance). Here numerous procedures offer themselves, in other respects of known prior art, for instance, the provision of a (compressive) spring unit or a similar form of energy store, the provision of another actuator (possibly again configured as an MSM actuator), or like means.

The device shown in FIG. 1, as also the examples of embodiment to be described in what follows, implement in an advantageous manner the advantages of a plurality of coils to be operated in parallel, i.e. in a superposed manner, for flux generation, without, for instance, detecting as in the prior art that too high a level of heat generation disadvantageously influences the operating properties and the efficiency of the device. The present invention also advantageously enables the implementation of very short switching times (and the therewith linked high operating frequencies for movements of the drive element), in particular relative to electromagnetic actuators of known art, since the actual expansion switching process occurs very rapidly in the MSM material. What is time-critical for the time behaviour is therefore just the implementation of the magnetic circuit, i.e. the speed with which the coil magnetic field can be built and collapsed (wherein its time constant in turn is affected by the ohmic coil resistance and the coil inductance). If then, as envisaged in accordance with further developments, for instance, an electrical series circuit of appropriately optimised coil arrangements is provided, without a contrary flux influence occurring, as inventively advantageously achieved, (such that, with respect to the magnetic circuit and the MSM element, the coil magnetic fluxes are introduced in a parallel manner), an effective optimisation is achieved of the interaction of a drive element with a plurality of coil devices so as to generate the movement magnetic field.

An alternative form of implementation as a form of embodiment of the invention, not shown in the figures, envisages that instead of two flux-conducting sections (28, 30 in FIGS. 1, 3 respectively), separately embodied and aligned parallel to one another, a common flux-conducting section is provided. Here too the advantageous flux management of FIG. 3 occurs (corresponding to the path of the arrows 32, 34), such that the inventive advantage of the parallel magnetic circuit, i.e. of a respective displacement of magnetic flux components from a flux-conducting circuit in each case located opposite can be achieved.

Figure 4:
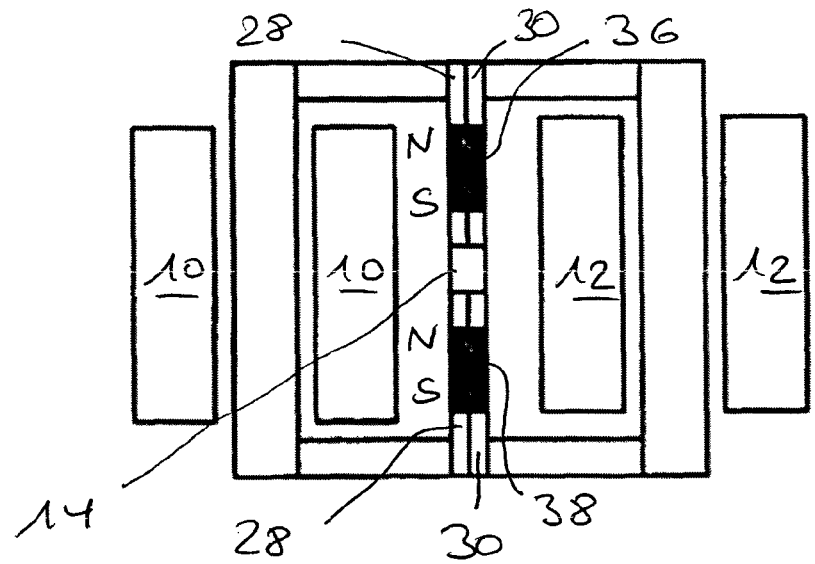
FIGS. 4 to 6 show various variants for the introduction of permanent magnetic bodies or sections (magnetised in the direction of the flux path) into the flux-conducting circuits of FIG. 3 and FIG. 1.
Figure 5:
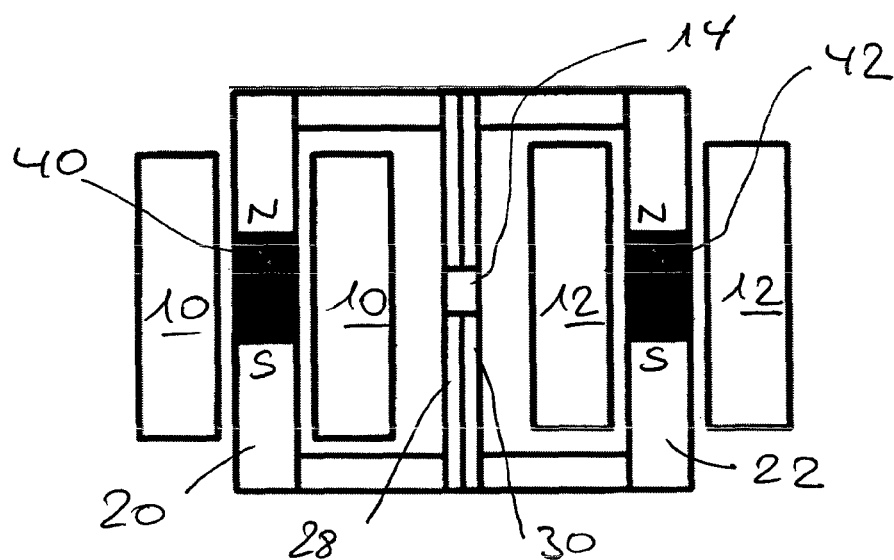
Figure 6:
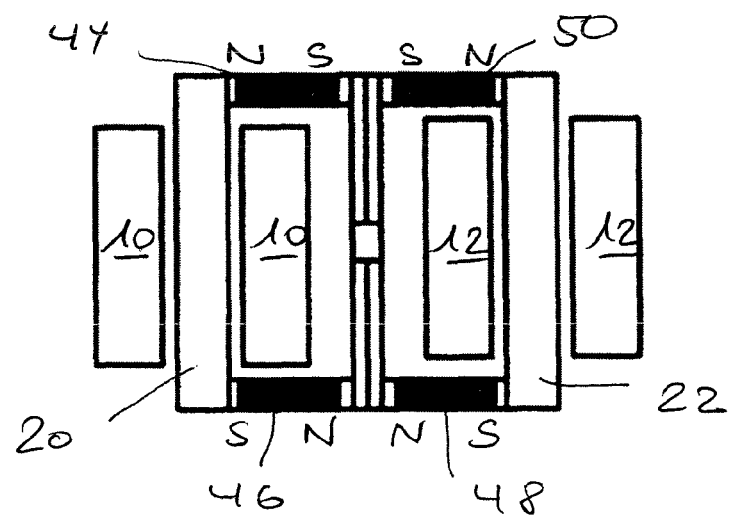

FIGS. 4 to 6 show a preferred further development of the invention in which permanent magnetic means, typically in the form of sections of the magnetic flux circuits of a permanent magnetic material with a permanent magnetisation along the flux direction, are coupled into various sections of the magnetic flux-conducting circuit and thus, for instance, cause a magnetic preload (as a result of the superposition of the permanent magnetic field on a respective coil magnetic field). The result is a further shortening of the switching time or expansion time, a smaller required coil magnetic field, or similar: thus the example of embodiment in FIG. 4 shows how permanent magnets 36, 38 are provided in the region of both flux-conducting sections 28, 30, and in fact can advantageously be used jointly by the respective magnetic flux-conducting circuits. The variant in FIG. 5 assigns permanent magnetic sections 40, 42 to the core sections 20, 22 respectively, and the further variant in FIG. 6 forms the connecting sections 24, 26 respectively in the magnetic flux circuits 16, 18 respectively with permanent magnetic elements 44, 46, 48, 50 poled in the respective flux directions.

Permanent magnets, for instance those corresponding to FIGS. 4 to 6, additionally enable advantageously, and through utilisation of the hysteresis of the MSM shape memory material a current-less, bi-stable switching behaviour: in that the drive element 14 (not shown in the figures) is mechanically pre-loaded against a compression spring or similar energy store, by means of a (pulse-shaped) energisation of the coil arrangement 10, 12 and with suitable dimensioning of the spring counterforce the drive element can be switched between an expanded and a retracted position and can permanently remain there in a current-less state.

The example of embodiment in FIGS. 7 to 9 shows a further option for the integration of permanent magnetic means in the magnetic flux-conducting circuit and for the optimisation of the flux path through the drive element 14 in a switchable, i.e. controllable, manner.

In an analogous manner to the form of implementation in FIG. 2 a coil device 10, 12 respectively for a magnetic flux-conducting circuit 16, 18 respectively is in turn connected with a frame-type arrangement with a first (28) or second (30) flux-conducting section, and also related connecting sections as legs of the respective U-profiled sheet metal arrangements. The drive element is held orthogonally relative to the coil axes between half-separated flux-conducting sections and has a direction of expansion along the arrow E.

A permanent magnet 52, 54 respectively is provided adjacent to each of the coil units 10, 12; which permanent magnet is axially magnetised, cf. the sectional view in FIG. 9, corresponding to the coil direction of extent and the orthogonal arrow direction E. Through the flux-conducting leg sections 24, 26 respectively (connecting sections) there takes place in the de-energised state (FIG. 9) a permanent magnetic flux through a core 20, 22 respectively of the magnetic flux-conducting circuits, as illustrated by the path of the arrows in FIG. 9.

However, as shown in FIG. 8, as soon as a coil magnetic field generates additional magnetic flux as a result of energisation of the coils 10 and 12, the latter displaces the flux path of an assigned permanent magnet 52, 54 respectively out of the core regions into the flux-conducting sections 28, 30 respectively, thus there is effective movement into the drive element (since the MSM material itself has a relatively high magnetic resistance, in the de-energised state of FIG. 9 it remains practically unaffected by the permanent magnetic flux).

In this manner it is possible to achieve advantageously in accordance with further developments that an additionally pre-loading, i.e. supporting, permanent magnetic field in a de-energised state of the coil devices (and in contrast to the examples of embodiment in FIGS. 4 to 6) does not reach the MSM material, while activation of the energisation leads to the fact that in the form of a diversion, not only is the coil magnetic flux managed through the drive element in a manner that is effective for expansion, but also the permanent magnetic field in a supplementary and reinforcing manner. Also by this means it is possible to achieve speed advantages, in particular as a result of the smaller coil field required for a movement process or switching process, and also large advantages as a result of the smaller coil build required.

The schematic sectional representations of FIGS. 15, 16 illustrate this functional principle, with reference to FIG. 1 and in a constructive further development of the schematic representation of the latter. An outwardly mounted permanent magnet 52 (FIG. 7) in FIG. 15, or two outwardly and laterally mounted permanent magnets 52, 54 are magnetically short-circuited by means of the core regions 20, 22. Energisation of the coils 10 and 12 then causes a displacement and also the addition of the permanent magnetic field with regard to the drive element 14. Here the constructive implementation is not limited to the schematic representations, for instance, of FIGS. 7 to 9, thus the at least one permanent magnetic unit can also be suitably provided externally on a magnetically conducting housing of the actuator, in this respect acting as a part of the magnetic circuit, wherein then, for instance, this housing section magnetically short-circuits the one or more permanent magnetic units and the shift and displacement of the permanent magnetic flux then occurs as a reaction to the coil energisation. Alternatively (and not represented in the figures) there is in turn the possibility of providing the at least one permanent magnetic unit suitably in a cut-out or an opening of a flux-conducting housing of the actuator, in turn with the same flux-conducting, i.e. outwardly mounted magnetic flux properties.

Over and above the principle shown in FIGS. 7 to 9, there is moreover the possibility, in accordance with further developments and advantageously in the context of the invention, to configure a permanent magnet, for example in an annular shape with axial magnetisation, and to arrange it around a coil of a coil device, such that for purposes of implementing these advantageous effects the flux effect occurs in the form of a parallel magnetic circuit.

FIG. 10 shows a further possible variant in the context of preferred examples of embodiment, wherein here—in a manner exemplary for numerous other variants—a further development of the build of FIG. 2 is shown such that for each of the two flux-conducting sections (or further related components of the magnetic flux-conducting circuit) a plurality of five coils (with in each case a centrally provided core element) is provided with the result that in the above described advantageous manner advantages can be implemented in terms of switching speed, heat generation characteristics, or similar.

The present invention is not limited to the above-described examples of embodiment. Thus it offers for example, by the deployment of suitable flux-conducting materials (such as sheeted flux-conducting parts, the deployment of special materials for instance silicon steels with reduced electrical conductivity and at the same time good magnetic properties) to increase further the switching speed.

While the flux-conducting circuits in the examples of embodiment shown have been represented in the form of a frame, within the context of preferred further developments of the invention it is possible to assemble these in a manner other than a plurality of individual components, wherein here in particular the use of identical parts lends itself in order to create systems for various applications, in this respect using a building block principle (for instance, with a variable number of coil units).

Also, in a further development of the concept of FIG. 10, the coils can be arranged above one another or near one another in other combinations, depending upon the build space requirements. Also the coils can be suitably matched to the respective requirements in terms of the configuration of windings, number of turns, or similar.

In the figures neither the housing structures nor the coil support structures are shown. However, these can be provided as required, alternatively, also the coil wire of a coil device can be wound directly onto the core section (possibly coated in advance for a higher dielectric strength), again with advantages in terms of cost and installation space.

In terms of housing structures, it is conceivable to deploy the arrangements or variants shown in suitable housing shells; additionally or alternatively to undertake insert moulding with plastic materials in other respects of known art for purposes of protection and/or stability.

The invention claimed is:

1. An actuator with
a drive element of a magnetic shape memory material that can be driven as a reaction to an electrical activation of a plurality of coil devices (10, 12) and designed for purposes of executing an expansion movement as a reaction to the activation,
wherein the coil devices are magnetically connected with the drive element (14) via flux-conducting means (20, 22, 24, 26, 28, 30), and a flux-conducting section of the flux-conducting means is assigned to the coil devices for purposes of interacting with the drive element,
the flux-conducting means for each of the plurality of coil devices have a core section (20, 22, 30) and also a connecting section (24, 26), conducting a magnetic flux to the drive element such that for each of the coil devices a magnetic flux-conducting circuit is formed through the common drive element, and
with reference to the common drive element the flux-conducting circuits are connected magnetically in parallel with each other, and/or a magnetic flux direction of a magnetic flux in the respective flux-conducting circuit in the drive element is aligned in the same directional sense,
characterised in that,
the drive element is configured in terms of a rectangular and/or a polygonal cross-section, and with plane outer surfaces, and an introduction of magnetic flux into the drive element does not take place along a longest axis or dimension of extent of the drive element
wherein the magnetic shape memory alloy material is selected having Ni, Mn, Ga and also at least Co in the composition $Ni_aMn_bGa_cCo_dFe_eCu_f$, wherein
a, b, c, d, e and f are specified in atom-%, and fulfil the conditions:
$44 \leq a \leq 51$;
$19 \leq b \leq 30$;
$18 \leq c \leq 24$;
$0.1 \leq d \leq 15$;
$0 \leq e \leq 14.9$;
$0 \leq f \leq 14.9$:
$d+e+f \leq 15$;
$a+b+c+d+e+f=100$.

2. The actuator in accordance with claim 1, wherein two of the plurality of coil devices are spaced apart from one another and are arranged opposite one another with reference to the drive element.

3. The actuator in accordance with claim 1, wherein a common flux-conducting section is coupled into the flux-conducting circuits so as to interact with the drive element.

4. The actuator in accordance with claim 1, wherein a first flux-conducting section (28) of the flux-conducting means is assigned to a first of the plurality of the coil devices so as to interact with the drive element, a second flux-conducting section (30) of the flux-conducting means is assigned to at least one other (12) of the plurality of the coil devices so as to interact with the drive element, and the first (28) and the second (30) flux-conducting sections are provided adjacent to one another, and are designed to be magnetically separated and/or decoupled from one another such that a reciprocal magnetic flux transfer and/or magnetic flux coupling between the first and the second flux-conducting sections is prevented or reduced in comparison to a common and/or one-piece flux-conducting body to be provided instead of the first and second flux-conducting sections.

5. The actuator in accordance with claim 4, wherein the first and the second flux-conducting sections are designed in at least some sections to be extended and running parallel to one another, and are also designed to be commonly contacting the drive element for purposes of introducing a magnetic flux.

6. The actuator in accordance with one of the claim 1, wherein the flux-conducting section and the connecting section are of one-piece design and/or are formed from of a single piece, or multiple pieces, of a magnetically conducting sheet metal material.

7. The actuator in accordance with one of the claim 1, wherein a closed magnetic flux-conducting circuit is assigned to each of the plurality of coil devices such that the coil device is provided around a respective core section of the flux-conducting circuit, the flux-conducting section is designed to be opposite to the core section in the flux-conducting circuit, and the plurality of the core sections (20,22) assigned to the coil devices, with reference to the drive element is arranged radially outwards and/or extending relative to one another with parallel axes.

8. The actuator in accordance with claim 1, further comprising permanent magnetic means (36-54), which as a section of a permanent magnetic material are connected with the flux-conducting means in a magnetically flux-conducting manner, and/or are coupled into a magnetic flux-conducting circuit for at least one of the flux-conducting sections.

9. The actuator in accordance with claim 8, wherein the permanent magnetic means (36-50) are coupled into the magnetic flux-conducting circuit such that in a de-energised activation state of a related coil device a permanent magnetic flux flows through a core section of the magnetic flux-conducting circuit and the permanent magnetic flux, as a reaction to the electrical activation of the coil device and a flux component thereby caused, is displaced into the related flux-conducting section and the drive element.

10. The actuator in accordance with claim 8, wherein the permanent magnetic means (36-50), as a body magnetised in a magnetic flux direction, is part of the flux-conducting section or one of the flux-conducting sections, of one of the core sections assigned to the coil devices, and/or of a connecting section connecting the core section with the drive element of a relevant magnetic flux-conducting circuit.

11. The actuator in accordance with claim 8, wherein the permanent magnetic means (36, 38) are designed as one or a plurality of bodies of a permanent magnetic material commonly assigned to the flux-conducting section/s.

12. The actuator in accordance with claim 1, wherein at least one of the coil devices is provided as a wire winding directly on a core section of the flux-conducting means, without an intermediate coil body.

13. The actuator in accordance with claim 1, further comprising restoring means assigned to the drive element, which are mechanically coupled with the drive element, and are implemented as an additional counteracting actuator having a shape memory material, or by means of a permanent magnet, and/or as an energy store.

14. The actuator in accordance with claim 1, further comprising housing means, which are designed as a shell of a magnetically conducting material and/or an insert moulding, in particular by means of a plastic material, at least partially surrounding the actuator and/or the coil means.

15. The actuator in accordance with claim 1, wherein the parallel-permanent magnet means (52, 54) are connected magnetically parallel to at least one of the coil devices such that a permanent magnetic flux of the permanent magnet means can occur through a related core section, a coil magnetic flux of the coil device is in a magnetically parallel manner, and/or in a rectified manner, superposed with a permanent magnetic flux of the parallel-permanent magnetic means flowing across the drive element, and an activation of at least one of the coil devices causes an at least partial magnetic flux shift of the permanent magnetic flux of the parallel-permanent magnetic means from the related core section via the drive element.

16. The actuator in accordance with claim 15, wherein a short-circuit section of the flux-conducting means outwards of the related core section is assigned to the at least one coil device so as to form at least one magnetic flux arm with no air gap, and the parallel-permanent magnetic means are connected magnetically in parallel to the at least one coil unit such that in a de-energised state of the coil device a permanent magnetic flux of the parallel-permanent magnetic means is managed via the short-circuit section in the form of a magnetic short-circuit, and the electrical activation of the coil unit causes the at least partial magnetic flux displacement of the permanent magnetic flux out of the short-circuit section into the related core section and also via the drive element.

17. The actuator in accordance with claim 16, wherein the short-circuit section is designed as a section of a flux-conducting housing shell of the actuator, which encloses the coil devices inside the casing, wherein the parallel-permanent magnetic means are provided on and/or in the housing shell, and are located externally on the housing shell or are accommodated in a particular extended and/or slot-shaped recess and/or opening in the housing shell.

* * * * *